United States Patent [19]

Dohmen et al.

[11] Patent Number: 5,759,747
[45] Date of Patent: Jun. 2, 1998

[54] METHOD OF MANUFACTURING A SEMICONDUCTOR DEVICE

[75] Inventors: Frank T. M. Dohmen, Nijmegen, Netherlands; Gunter J. Elmendorff, Kleve, Germany; Theodorus M. Lavrijsen, Nijmegen, Netherlands

[73] Assignee: U.S. Philips Corporation, New York, N.Y.

[21] Appl. No.: 738,562

[22] Filed: Oct. 28, 1996

[30] Foreign Application Priority Data

Oct. 26, 1995 [EP] European Pat. Off. ............ 95202907

[51] Int. Cl.$^6$ ........................................... G03C 5/00
[52] U.S. Cl. .................. 430/313; 430/272.1; 430/327; 430/943
[58] Field of Search ........................ 430/313, 327, 430/943, 272.1

[56] References Cited

U.S. PATENT DOCUMENTS

| | | |
|---|---|---|
| 4,910,122 | 3/1990 | Arnold et al. ............ 430/313 |
| 5,360,768 | 11/1994 | Ohmi et al. ............ 437/238 |
| 5,405,802 | 4/1995 | Yamagata et al. ............ 437/71 |

Primary Examiner—Janet C. Baxter
Assistant Examiner—Rosemary Ashton
Attorney, Agent, or Firm—Daniel E. Tierney

[57] ABSTRACT

The invention provides a method which can suitably be used to mass-produce semiconductor devices. This method includes the following steps: a) providing a silicon surface with an anti-reflective layer which is made predominantly from a mixture of polyimide and polyamidic acid, b) providing the anti-reflective layer with a photosensitive layer which is subjected to patterned radiation and then developed thus forming an etch mask of the photosensitive layer and the anti-reflective layer, c) etching the freed parts of the silicon surface, and d) removing the etch mask. The method in accordance with the invention is characterized in that, prior to applying the anti-reflective layer, the silicon surface is exposed to an oxidative treatment in which, preferably, an aqueous solution of hydrogen peroxide with ammonia or sulphuric acid is used. By virtue of this measure in accordance with the invention, the undesired etching away of small silicon structures is precluded. Said method in accordance with the invention can very advantageously be used to manufacture so-called "buried oxide" structures and, in particular, to manufacture "polylines".

12 Claims, 2 Drawing Sheets

1

METHOD OF MANUFACTURING A SEMICONDUCTOR DEVICE

BACKGROUND OF THE INVENTION

The invention relates to a method of manufacturing a semiconductor device, in which a silicon surface is structured photolithographically, said method including the following steps:

a. providing the silicon surface with an anti-reflective layer which is composed predominantly of a mixture of polyimide and polyamidic acid, b. providing the anti-reflective layer with a photosensitive layer which is exposed to patterned radiation and then developed, thus forming an etch mask of the photosensitive layer and the anti-reflective layer, c. etching the freed parts of the silicon surface, d. removing the etch mask.

Such a method is indicated in United States Patent Specification U.S. Pat. No. 4,910,122. In example 7 of said Patent publication, a description is given of how a silicon wafer is provided with an anti-reflective layer by means of spin coating, said anti-reflective layer subsequently being provided with a photosensitive layer. The wafer thus prepared is subsequently exposed to patterned radiation and developed. After the removal of the exposed parts of the photosensitive layer and the underlying anti-reflective layer, a sharp image of the mask used is obtained. The wafer thus obtained can subsequently be etched in a customary manner.

An anti-reflective layer as described hereinabove precludes the formation of artifacts in the photosensitive layer. Said artifacts can be caused by reflections of the radiation used during patterned exposure of the photosensitive layer. The known anti-reflective layer comprises a mixture of polyamidic acid and polyimide. Such a mixture is a product of a reaction between dianhydrides and diamines. They react to form polyamidic acid which is subsequently converted to polyimide by the removal of water and cyclization. Dependent upon the reaction conditions, an equilibrium mixture of said polyimide and said polyamidic acid is obtained, the polyamidic acid being heated to form polyimide.

Problems are encountered when the known method is carried out under mass-production conditions. Visual inspection of the semiconductor devices structured in this manner has revealed that errors occur in the manufacture of relatively thin silicon structures. For example, it was found that relatively thin silicon structures were etched away in masked regions. This problem is more serious as the dimensions of the smallest silicon structures get smaller. In silicon structures having a smallest dimension of 0.8 micrometer or less, this disadvantage is found to be unacceptable.

SUMMARY OF THE INVENTION

It is an object of the invention to mitigate the above disadvantage. The invention more particularly aims at providing a method in which the undesired etching away of silicon structures having relatively small dimensions is obviated. The method in accordance with the invention should also be suitable for mass-production.

These and other objects of the invention are achieved by a method of the type mentioned in the opening paragraph, which is characterized in that the surface of the silicon layer is exposed to an oxidative treatment before the anti-reflective layer is provided.

The invention is based on the recognition that the above problem is caused by insufficient adhesion between the anti-reflective layer and the silicon. In experiments leading to the invention it has been established that said adhesion is based predominantly on the formation of hydrogen bridges between the hydrogen atoms of the anti-reflective layer and hydroxy groups present on the surface of the silicon. It has further been found that owing to mass-production conditions, the number of hydroxy groups on the surface of silicon is minimal. This can be attributed, in particular, to the fact that, prior to the application of the anti-reflective layer, the silicon surface is exposed to a hydrogen-fluoride treatment, for example by immersing said silicon surface in an aqueous solution containing 1% HF. This is a standard treatment known as such for mass-produced wafers which are subjected to lithography. Due to this, all kinds of impurities are removed from the silicon surface. Commonly used materials of photosensitive layers customarily do not adhere to silicon by means of hydrogen bridges.

Owing to insufficient adhesion between the anti-reflective layer and the surface of the silicon, said anti-reflective layer may become detached during the etching process. This results in small structures undesirably being etched away from the silicon surface. This occurs particularly in masked silicon structures whose smallest dimensions are below 0.8 micrometer. Application of the inventive method mitigates this drawback. Both positive and negative lacquers can be used for the photosensitive layer.

The method in accordance with the invention can very advantageously be used to provide so-called "buried oxide" structures in a layer of silicon. Details of this application of the method in accordance with the invention are described in the first exemplary embodiment.

A preferred embodiment of the method in accordance with the invention is characterized in that the silicon layer is made from electrically conducting polycrystalline silicon which is provided on a surface of a monocrystalline silicon substrate covered with a thin layer of silicon oxide, and in that the layer of polycrystalline silicon is etched through in the etching process.

This embodiment of the method in accordance with the invention enables sharply structured tracks of conductive polycrystalline silicon (so-called "polylines") to be manufactured. Details of this application of the method in accordance with the invention are described in the second exemplary embodiment.

The oxidative treatment of the silicon surface can be carried out in various ways. For example, it is possible to subject the surface to a corona treatment. A corona is an electric discharge which is formed under the influence of a strong, inhomogeneous field close to an electrode with a small radius of curvature. The disadvantage of a corona treatment, however, is that it is accompanied by strong electrical fields. As a result, charging phenomena may occur in the final semiconductor device.

A favourable embodiment of the method in accordance with the invention is characterized in that the oxidative treatment takes place by exposing the silicon to a solution comprising an oxidative agent. In principle, all suitable oxidative agents can be used. The disadvantageous effect of the above-mentioned corona treatment does not take place in this embodiment.

Another interesting embodiment of the method is characterized in accordance with the invention in that the oxidative treatment takes place in an acid medium. The use of a mixture comprising sulphuric acid, hydrogen peroxide and water proved to be very efficient.

Good results were also obtained with a method which is characterized in that the oxidative treatment takes place in an alkaline medium. In this respect, a solution comprising a mixture of ammonia, hydrogen peroxide and water proved to be very effective.

These and other aspects of the invention will be apparent from and elucidated with reference to the embodiments described hereinafter.

Figure 1A:
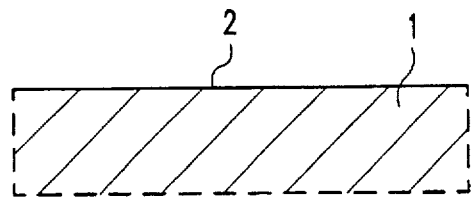
FIG. 1 schematically shows a number of steps of the method in accordance with the invention, such as used in the manufacture of so-called "buried oxide" structures.
Figure 1B:
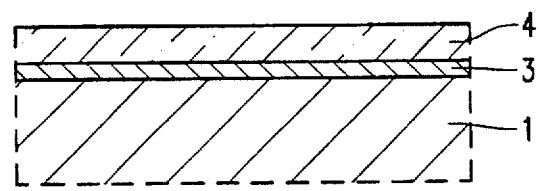
Figure 1C:
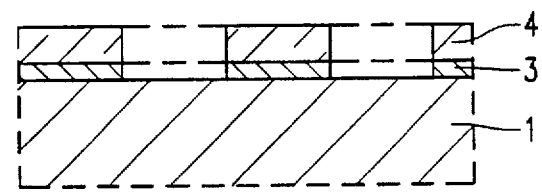
Figure 1D:
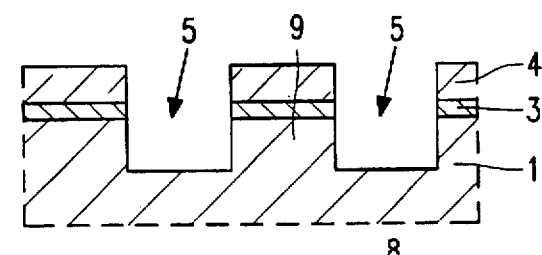
Figure 1E:
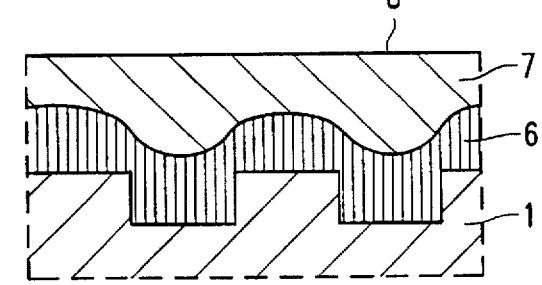
Figure 1F:
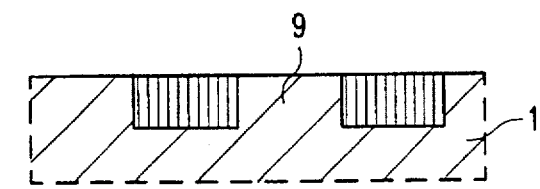

It is noted that, for clarity, the Figures are not drawn to scale.

DETAILED DESCRIPTION OF THE PREFERRED EMBODIMENT

Exemplary Embodiment 1

FIG. 1 shows a number of steps of the method in accordance with the invention to manufacture so-called "buried oxide" structures. FIG. 1-A shows a through section of, an 8-inch monocrystalline silicon wafer 1 said wafer was previously treated with an aqueous 1% HF-solution to remove impurities from the surface 2 of the wafer. Subsequently said wafer was immersed in a solution containing an oxidative agent. In the present case, said solution was an aqueous solution comprising 14 vol. % hydrogen peroxide (30%) and 14 vol. % ammonia (25%). Subsequently, the wafer was rinsed with pure water, and dried.

The surface 2 of the wafer, which was cleaned and oxidized as described above, was provided with an anti-reflective layer 3 (FIG. 1-B). This layer was predominantly composed of a mixture of polyimide and polyamidic acid. To this end, 5 wt. % of this mixture in a solution of N-methyl pyrrolidone and cyclohexanone were provided on the surface 2 by a standard spin-coating process. This solution is commercially available under the tradename XLT-BARC (Brewer). Subsequently, the layer thus formed was cured by subjecting it to a temperature of 183° C. for 55 seconds. The layer thus formed had a thickness of 135 nm (±5 nm).

The anti-reflective layer 3 thus formed was provided with a photosensitive layer 4 (Novolak Shipley; layer thickness 1.7 micrometers) by means of a standard spin-coating process. This layer was successively exposed to patterned radiation, developed with an aqueous solution of 2.38% TMAH (tetramethyl ammonium hydroxide) and cured at 110° C. for 30 seconds (FIG. 1-C). Subsequently, the structure obtained was anisotropically etched by means of plasma-etching techniques. In this process, the grooves 5 are formed in the silicon wafer.

After the removal of the etch mask (i.e. the unexposed parts of the photosensitive layer and the underlying anti-reflective layer), a relatively thick layer 6 of polycrystalline silicon oxide (TEOS) was provided on the structured surface of the wafer by means of a sol-gel process. A new layer of a photosensitive material 7 (Hunt HPR 204) was provided thereon by spin coating, so that a relatively level surface 8 was formed (FIG. 1-D). The layer 7 and part of layer 6 were finally etched away by means of a plasma-etching technique which is known per se, so that the desired "buried oxide" structure of FIG. 1-F was obtained.

In a number of comparative experiments, a first number of wafers were pre-treated with an oxidative agent and a second number of wafers were not subjected to said pre-treatment. Also in this case, the oxidative agent used was an aqueous solution comprising 14 vol. % hydrogen peroxide (30%) and 14 vol. % ammonia (25%). The wafers pre-treated according to the invention did not show defects. In various non-pretreated wafers, it was found that one or more of the desired intermediate structures 9 were etched away.

Exemplary Embodiment 2

Figure 2A:
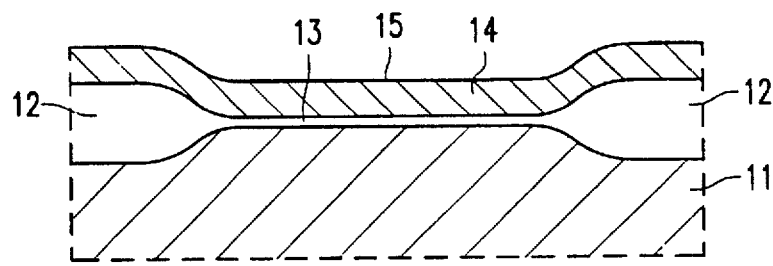
FIG. 2 schematically shows a number of steps of the method in accordance with the invention, such as used in the manufacture of so-called "polylines".
Figure 2B:
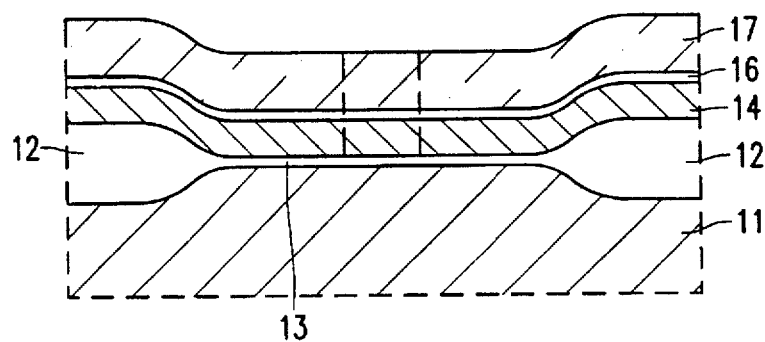
Figure 2C:
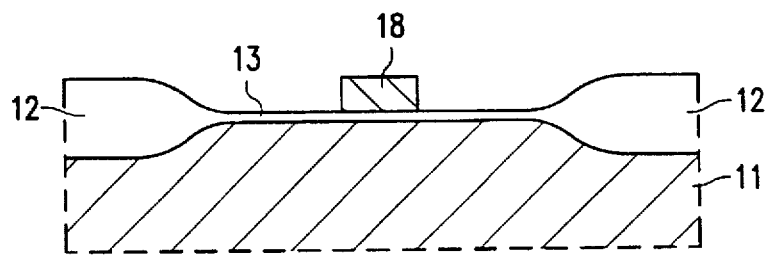

FIG. 2 schematically shows a number of steps of the inventive method for the manufacture of so-called conductive polycrystalline tracks (polylines). FIG. 2-A shows a through section of an 8-inch monocrystalline silicon wafer 11. This wafer was locally provided with thick layers of silicon oxide 12 by means of the LOCOS technology, which is known per se, a thin layer of silicon oxide 13 (gate oxide) being interposed between said silicon-oxide layers. A layer 14 of polycrystalline silicon was provided on the layers 12 and 13 by means of LPCVD. This layer was doped with phosphor in a known manner, causing the polysilicon to become electrically conducting. This step was carried out in a $PH_3/O_2$-containing atmosphere. This step can alternatively be carried out at a later stage. The wafer structure thus obtained is shown in FIG. 2-A. The polylines are manufactured from layer 14.

The wafer structure shown in FIG. 2-A was pre-treated with an aqueous 1% HF solution to remove the glass layer of $P_2O_5$ and $SiO_2$ formed at the surface 15. Said layer is formed in the doping operation from the $PH_3$ and $O_2$ present. Subsequently, the wafer was immersed in a solution comprising an oxidative agent. In the present case, said solution was an aqueous solution of 0.83 vol. % hydrogen peroxide (30%) in 96% sulphuric acid (piranha-solution). Subsequently, the wafer was rinsed with pure water.

The surface 15 of the wafer which was cleaned and oxidized as described above was provided with an anti-reflective layer 16. This layer was composed predominantly of a mixture of polyimide and polyamidic acid. For this purpose, 5 wt. % of this mixture in a solution of N-methyl pyrrolidone and cyclohexanone was provided on the surface 15 by a standard spin-coating process. This solution is commercially available under the tradename XLT-BARC (Brewer). Subsequently, the layer thus formed was cured by subjecting it to a temperature of 186° C. for 40 seconds. The layer thus obtained had a thickness of 125 nm (±5 nm).

The anti-reflective layer 16 thus formed was provided with a photosensitive layer 17 (Novolak Shipley; layer thickness 1.185 micrometers) by means of a standard spin-coating process. This layer was successively exposed to patterned radiation, developed with an aqueous solution of sulphuric acid and hydrogen peroxide and cured (30 s at 110° C.). Subsequently, the structure obtained, shown in FIG. 2-B, was etched through to the surface of the layer of silicon oxide by means of a plasma-etching technique which is known per se. The unexposed parts of the photosensitive layer and the underlying anti-reflective layer (etch mask) were subsequently removed by means of a piranha solution. The wafer structure thus obtained, having electrically conducting tracks 18 of polycrystalline silicon (polylines), is schematically shown in FIG. 2-C. In the present case, the line width of the polylines was 0.8 micrometer. The structure shown can be processed further, in known manner, to form a transistor.

In a first number of comparative experiments a first number of wafers were pre-treated with an oxidative agent and a second number of wafers were not subjected to such a pre-treatment. The oxidative agent used in this case was an aqueous solution comprising 14 vol. % hydrogen peroxide (30%) and 14 vol. % ammonia (25%) or a piranha solution. The wafers pre-treated according to the invention did not show defects. In various non-pretreated wafers one or more of the desired polylines were completely or partly etched away.

A comparison between pre-treated wafers revealed that the use of the oxidative agent comprising sulphuric acid yields better results than the ammonia-containing solution. In the former case, bridge-shaped structures were not formed between different polylines. When the ammonia, containing solution was used, a few instances of such undesired structures were observed. It is assumed that their development can be attributed to the presence of residues of unexposed parts of the anti-reflective layer which cannot be removed to a sufficient degree in the developing step.

The present invention provides a method which can suitably be used to mass-produce semiconductor devices. By subjecting the surface of the wafer structure to said oxidative treatment, the undesirable etching away of small silicon structure is precluded. The method in accordance with the invention can very advantageously be used in the manufacture of so-called "buried oxide" structures and, in particular in the manufacture of "polylines".

What is claimed is:

1. A method of manufacturing a semiconductor device, in which a silicon surface is structured photolithographically, said method comprising the steps of:

a. exposing the silicon surface to an oxidative treatment to form an oxidized silicon surface,
    b. depositing an anti-reflective layer directly on the oxidized silicon surface, the anti-reflective layer being composed predominately of a mixture of polyimide and polyamidic acid,
    c. depositing a photosensitive layer on the anti-reflective layer,
    d. exposing the photosensitive layer to patterned radiation and then developing the exposed photosensitive layer, thus forming an etch mask of the photosensitive layer and the anti-reflective layer and uncovering parts of the silicon surface,
    e. etching the uncovered parts of the silicon surface, and
    f. removing the etch mask.

2. A method as claimed in claim 1, characterized in that the silicon surface is a surface of a layer of electrically conducting polycrystalline silicon, the polycrystalline silicon layer being provided on a silicon oxide layer and the silicon oxide layer being provided on a monocrystalline silicon substrate, and in that the layer of polycrystalline silicon is etched through in the etching step.

3. A method as claimed in claim 2, characterized in that the oxidative treatment takes place by exposing the silicon to a solution comprising an oxidative agent.

4. A method as claimed in claim 3, characterized in that the oxidative treatment takes place in an acid medium.

5. A method as claimed in claim 4, characterized in that the solution comprises a mixture of sulfuric acid, hydrogen peroxide and water.

6. A method as claimed in claim 3, characterized in that the oxidative treatment takes place in an alkaline medium.

7. A method as claimed in claim 6, characterized in that the solution comprises a mixture of ammonia, hydrogen peroxide and water.

8. A method as claimed in claim 1, characterized in that the oxidative treatment takes place by exposing the silicon to a solution comprising an oxidative agent.

9. A method as claimed in claim 8, characterized in that the oxidative treatment takes place in an acid medium.

10. A method as claimed in claim 9, characterized in that the solution comprises a mixture of sulphuric acid, hydrogen peroxide and water.

11. A method as claimed in claim 8, characterized in that the oxidative treatment takes place in an alkaline medium.

12. A method as claimed in claim 11, characterized in that the solution comprises a mixture of ammonia, hydrogen peroxide and water.

* * * * *